United States Patent [19]

Smith

[11] Patent Number: 5,032,741
[45] Date of Patent: Jul. 16, 1991

[54] CDCFL LOGIC CIRCUITS HAVING SHARED LOADS

[75] Inventor: Robert T. Smith, Mesa, Ariz.

[73] Assignee: Motorola, Inc., Schaumburg, Ill.

[21] Appl. No.: 532,723

[22] Filed: Jun. 4, 1990

[51] Int. Cl.[5] .......................... H03K 3/26; H03K 3/289
[52] U.S. Cl. .................................. 307/279; 307/272.2
[58] Field of Search ............. 307/279, 494, 496, 272.2, 307/443, 448

[56] References Cited

U.S. PATENT DOCUMENTS

| | | | |
|---|---|---|---|
| 4,629,911 | 12/1986 | Bebernes | 307/279 |
| 4,656,371 | 4/1987 | Binet et al. | 307/272.2 |
| 4,678,934 | 7/1987 | Magome et al. | 307/279 |
| 4,965,468 | 10/1990 | Nicollini et al. | 307/494 |
| 4,970,406 | 11/1990 | Fitzpatrick et al. | 307/279 |

*Primary Examiner*—Stanley D. Miller
*Assistant Examiner*—Andrew Sanders
*Attorney, Agent, or Firm*—Bradley J. Botsch

[57] ABSTRACT

A CDCFL latch circuit having a plurality of inputs and first and second outputs includes a gate circuit responsive to logic input signals supplied to the plurality of inputs for providing complementary output logic signals at the first and second outputs when the gate circuit is rendered operative. A regeneration circuit is coupled to the first and second outputs for maintaining the complementary output logic signals at the first and second outputs when the regeneration circuit is rendered operative and the gate circuit is rendered non-operative. A shared load circuit provides current to the gate circuit when the gate circuit is operative and for providing current to the regeneration circuit when the regeneration circuit is operative. A control circuit responsive to a complementary clock signal and coupled between the shared load circuit and the gate and regeneration circuits alternately renders the gate circuit operative when the complementary clock signal is in a first logic state and the regeneration circuit operative when the complementary clock signal is in a second logic state.

11 Claims, 2 Drawing Sheets

5,032,741

CDCFL LOGIC CIRCUITS HAVING SHARED LOADS

BACKGROUND OF THE INVENTION

This invention pertains to latch circuits and, in particular, to complementary direct-coupled FET logic (CDCFL) latch circuits.

Latch circuits have numerous applications and are well known in the art. A latch circuit typically consists of an acquire stage and a regeneration stage where data is clocked into the acquire stage when a clock is in first logic state and then stored in the regeneration stage when the clock is in a second logic state, as is known. Most technology has utilized two separate load devices within a latch circuit: one for providing current to the acquire stage and another for providing current to the regeneration stage. Furthermore, since each load device draws a predetermined current, the power of most field-effect transistor (FET) circuits is directly proportional to the number of load devices used therein. Therefore, if a single load device could be shared between two different field effect transistors, a substantial power reduction would result along with a decrease in device count.

Source-coupled FET logic (SCFL) technology has attempted to utilize shared load devices for various applications and circuits. However, SCFL technology, similar to ECL technology, requires the use of a current source coupled to the common sources of two field-effect transistors for operation. Furthermore, to operate SCFL with other FET logic, two separate voltage levels are needed to provide logic level compatibility.

DCFL technology has also attempted to utilize shared load devices and one example is fully disclosed in U.S. patent application entitled "DCFL LATCH HAVING A SHARED LOAD" having U.S. Ser. No. 516,632 and filed on Apr. 30, 1990. However, the above mentioned patent application teaches single-ended use only and does not teach nor suggest a complimentary latch of any kind.

Hence, a need exists for a complimentary direct-coupled FET logic (CDCFL) latch circuit having shared load devices which results in minimum power and minimum device count.

SUMMARY OF THE INVENTION

Accordingly, it is an object of the present invention to provide an improved latch circuit.

Another object of the present invention is to provide a complementary direct-coupled FET logic latch circuit utilizing shared load devices which result in a decrease in power dissipation and device count.

Yet another object of the present invention is to provide a complementary direct-coupled FET logic latch circuit utilizing a single power supply.

In carrying out the above and other objects of the present invention, there is provided a complementary direct-coupled field-effect transistor logic latch circuit having a plurality of inputs and first and second outputs comprising a gate circuit responsive to logic input signals supplied to the plurality of inputs for providing complementary output logic signals at the first and second outputs when the gate circuit is rendered operative; a regeneration circuit coupled to the first and second outputs for maintaining the complementary output logic signals at the first and second outputs when the regeneration circuit is rendered operative and the gate circuit is rendered non-operative; a shared load circuit for providing current to the gate circuit when the gate circuit is operative and for providing current to the regeneration circuit when the regeneration circuit is operative; and a control circuit responsive to a complementary clock signal supplied to first and second inputs and coupled between the shared load circuit and both the gate and regeneration circuits for alternately rendering the gate circuit and the regeneration circuit operative and non-operative.

The above and other objects, features and advantages of the present invention will be better understood from the following detailed description taken in conjunction with the accompanying drawings.

DETAILED DESCRIPTION OF THE PRESENT INVENTION

Figure 1:
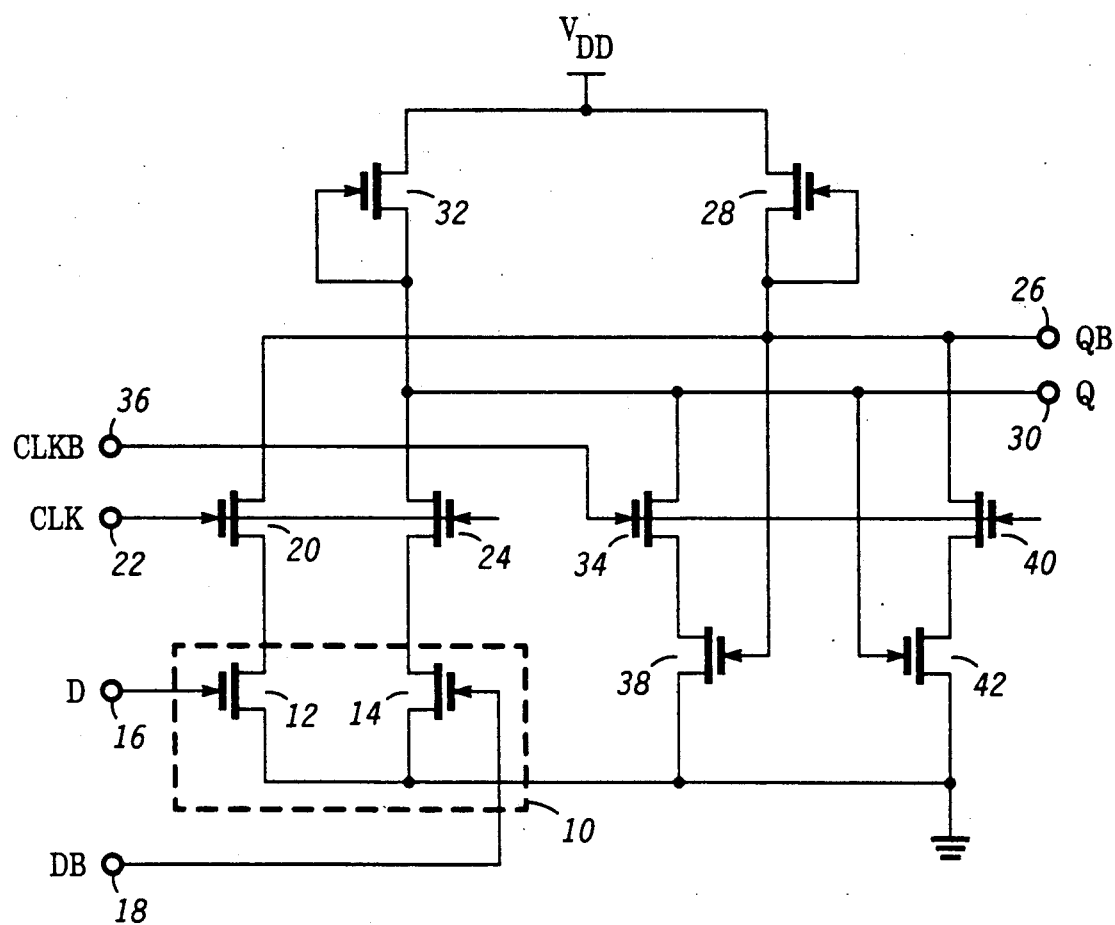
FIG. 1 is a detailed schematic diagram illustrating a first embodiment of the latch circuit of the present invention.

Referring to FIG. 1, a detailed schematic diagram of a first embodiment of the latch circuit of the present invention is shown comprising gate circuit 10 which includes FETs (field-effect transistors) 12 and 14 both of which have their source electrodes returned to ground. The gate electrode of FET 12 is coupled to input terminal 16 while the gate electrode of FET 14 is coupled to input terminal 18. Further, the drain electrodes of FETs 12 and 14 are coupled to first and second outputs of gate circuit 10 respectively.

The first embodiment of the present invention further comprises FET 20 having a source electrode coupled to the first output of gate circuit 10 and a gate electrode coupled to input terminal 22 and to a gate electrode of FET transistor 24. The drain electrode of FET 20 is coupled to output terminal 26 and to the source and gate electrodes of FET 28. The drain electrode of FET 24 is coupled to output terminal 30 and to the gate and source electrodes of FET 32. The source electrode of FET 24 is coupled to the second output of gate circuit 10. The drain electrodes of FET 28 and 32 are coupled to a first supply voltage terminal at which the operating potential $V_{DD}$ is applied. FET 34 has a drain electrode coupled to output terminal 30, a gate electrode coupled to input terminal 36 and a source electrode coupled to the drain of FET 38. FET 38 further has a gate electrode coupled to output terminal 26 and a source electrode returned to ground. FET 40 has a drain electrode coupled to output terminal 26, a gate electrode coupled to input terminal 36, and a source electrode coupled to the drain electrode of FET 42. The gate electrode of FET 42 is coupled to output terminal 30 while the source of the same is returned to ground.

In operation, differential signals D1 and DB are typically applied to input terminals 16 and 18 whereby the non-inverting input signal is applied to input terminal 16 while the inverting input signal is applied to input terminal 18. Also, a differential logic clock signal is typically applied to input terminals 22 and 36 whereby the non-inverting clock signal (CLK) is applied to input terminal 22 while the inverting clock signal (CLKB) is applied to input terminal 36. In addition, a differential output signal is provided at output terminals 26 and 30 whereby the non-inverting output signal (Q) is provided at output terminal 30 while the inverting output signal (QB) is provided at output terminal 26. When the differential logic clock signal is in a first logic state, for example, a logic high applied to input terminal 22 and a corresponding logic low applied to input terminal 36, FETs 20 and 24 are rendered operative while FETs 34 and 40 are rendered non-operative, where FETs 20, 24, 34 and 40 comprise a control circuit for rendering gate circuit 10 and regeneration circuit (FETs 38 and 42) operative and non-operative. This energizes gate circuit 10 such that if a logic high is applied to input terminal 16, FET 12 is rendered operative and the current supplied by load device FET 28 has a path to ground by flowing through FETs 20 and 12. This will result in providing a logic low at output terminal 26 since FET 28 is active and the voltage drop across the drain to source of FET 28 is a predetermined voltage such that a logic low voltage level is provided at output terminal 26. Furthermore, since a logic high was applied to input terminal 16, a corresponding logic low will be applied to input terminal 18 thereby rendering FET 14 non-operative. Since FET 14 is rendered non-operative, the current supplied by load device FET 32 will not have a path to ground. Thus, output terminal 30 will be at a logic high since the voltage drop across the drain to source of FET 32 is very small and output terminal 32 is approximately equal to the operating potential $V_{DD}$. Therefore, it has been shown that for a logic high applied at input terminal 16 and a corresponding logic low applied at input terminal 18, a logic high will occur at output terminal 30 and a logic low will occur at output terminal 26, as to be expected for a latch circuit. It should be realized, however, that if a logic low was applied to input terminal 16 and a corresponding logic high applied to input terminal 18, then the logic levels at output terminals 26 and 30 would be reversed thereby resulting in a logic high occurring at output terminal 26 and a logic low occurring at output terminal 30. In summary, when control circuit FETs 20 and 24 are rendered operative, output terminals 26 and 30 are responsive to the logic levels applied at input terminals 16 and 18.

On the other hand, when the differential clock signal is in a second logic state, for example, a logic high applied to input terminal 36 and a corresponding logic low applied to input terminal 22, control circuit FETs 34 and 40 are rendered operative while control circuit FETs 20 and 24 are rendered non-operative. Since control circuit FETs 20 and 24 are rendered non-operative, gate circuit 10 is not energized and the logic levels at output terminals 26 and 30 are not responsive to the logic levels at input terminals 16 and 18. However, since control circuit FETs 34 and 40 are rendered operative, the regeneration stage of the latch circuit which includes FETs 38 and 42, is rendered operative. Therefore, the logic levels present at output terminals 26 and 30 will be maintained thereat while control circuit FETs 34 and 40 are rendered operative. As an example, consider a logic high present at output terminal 30 and a corresponding logic low present at output terminal 26. The logic high at output terminal 30 will render FET 42 operative and provide the current supplied by load device FET 28 with a path to ground through FETs 40 and 42. Therefore, since load device FET 28 is conductive, output terminal 26 will be maintained at a logic low. Further, the logic low occurring at output terminal 26 will render FET 38 non-operative and, thus, the current supplied by load device FET 32 will not have a path to ground and current will not flow through FET 32. Therefore, since FET 32 is not conductive, output terminal 30 will be maintained at a logic high. It is important to realize from the foregoing discussion that load device FETs 28 and 32 are shared load devices such that when the complementary clock signal is a first logic state, load device FETs 28 and 32 provide current to gate circuit 10, and when the complementary clock signal is in a second logic state, load device FETs 28 and 32 provide current to FETs 38 and 42 (the regeneration stage).

Figure 2:
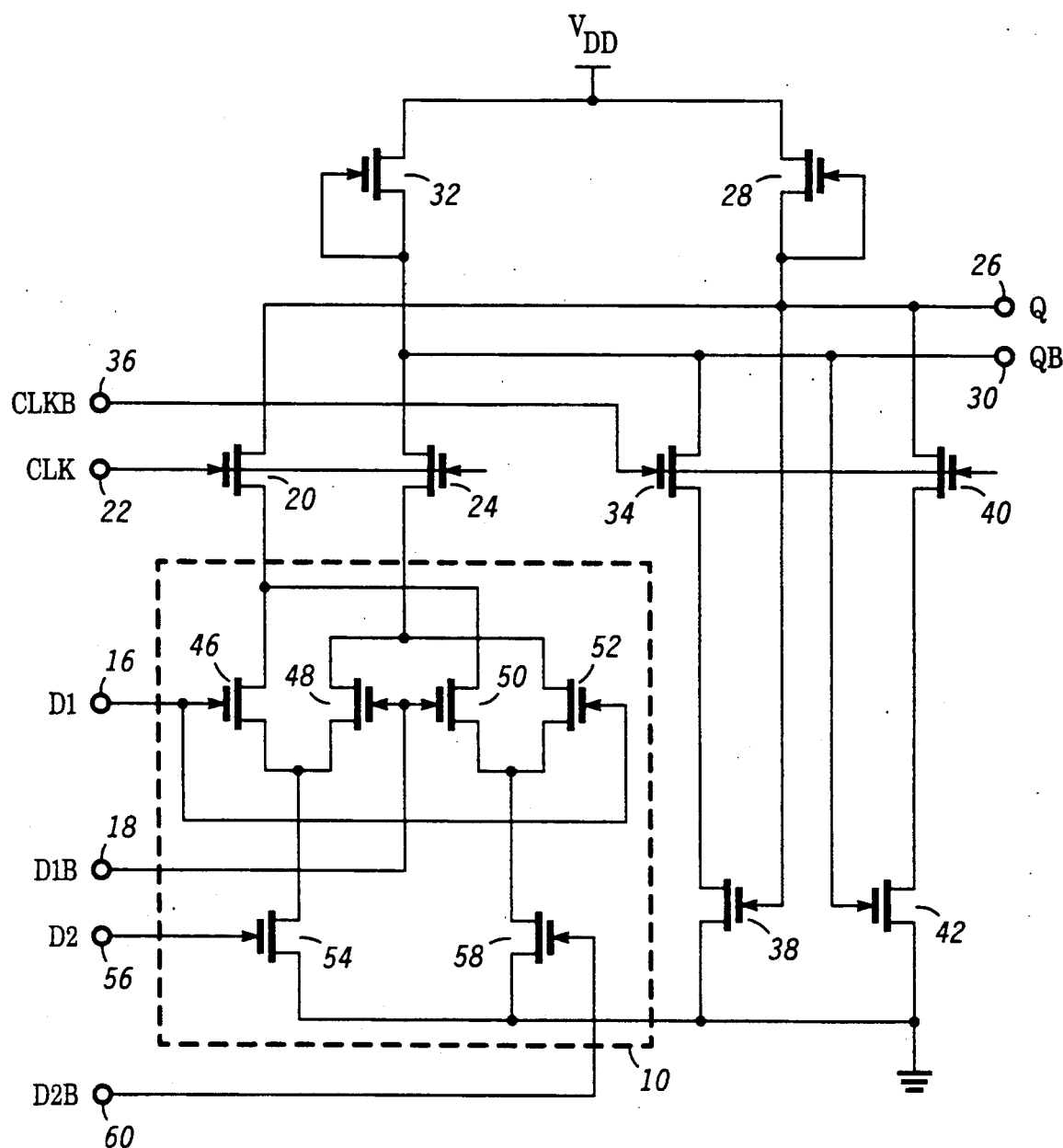
FIG. 2 is a detailed schematic diagram illustrating a second embodiment of the latch circuit of the present invention.

Referring to FIG. 2, a detailed schematic diagram illustrating a second embodiment of the latch circuit of the present invention is shown, it is understood that components similar to those of FIG. 1 are designated by the same reference numerals. The second embodiment of the latch circuit of the present invention comprises gate circuit 10 which includes FET 46 having a drain electrode coupled to the first output of gate circuit 10, a gate electrode coupled to input terminal 16, and a source electrode coupled to the source electrode of FET 48. The gate electrode of FET 48 is coupled to input terminal 18 and to the gate electrode of FET 50. The drain electrode of FET 48 is coupled to the second output of gate circuit 10 while the drain electrode of FET 50 is coupled to the first output of gate circuit 10. The source electrode of FET 50 is coupled to the source electrode of FET 52, the latter having a gate electrode coupled to input terminal 16 and a drain electrode coupled to the second output of gate circuit 10. Transistor 54 has a drain electrode coupled to the source electrodes of FETs 46 and 48, and a gate electrode coupled to input terminal 56. The source electrode of FET 54 is coupled to the source electrode of FET 58 and returned to ground. The drain electrode of FET 58 is coupled to the source electrode of FETs 50 and 52, while the gate electrode of FET 58 is coupled to input terminal 60.

In operation, differential signals D1 and D1B are typically applied to input terminals 16 and 18 whereby the non-inverting input signal is applied to input terminal 16 while the inverting input signal is applied to input terminal 18. Also, differential signals D2 and D2B are typically applied to input terminals 56 and 60 whereby the non-inverting input signal is applied to input terminal 56 while the inverting input signal is applied to input terminal 60. In addition, a differential logic clock signal is typically applied to input terminals 22 and 36 whereby the non-inverting clock signal (CLK) is applied to input terminal 22 while the inverting clock signal (CLKB) is applied to input terminal 36. Finally, a differential output signal is provided at output terminals 26 and 30 whereby the non-inverting output signal (Q) is provided at output terminal 26 while the inverting output signal (QB) is provided at output terminal 30. The operation of the second embodiment shown in FIG. 2 is similar to the operation of the first embodiment shown in FIG. 1, with the exception of gate circuit 10. As aforedescribed for the circuit shown in FIG. 1, gate circuit 10 functioned such that the logic levels occurring at input terminals 16 and 18 appeared at output terminals 30 and 26, if control circuit FETs 20 and 24 were rendered operative. However, gate circuit 10 of FIG. 2 functions as an exclusive-OR (XOR) gate such that if the differential signal applied to input terminals 16 and 18 is in the same logic state as the differential signal applied to input terminals 56 and 60, a logic high will be present at output terminal 26 while a logic low will be present at output terminal 30, as is well understood. Furthermore, if the differential signal applied to input terminals 16 and 18 is in a different logic state as the differential signal applied to input terminals 56 and 60, a logic low will be present at output terminal 26 while a logic high will be present at output terminal 30, as is also well understood. Therefore, gate circuit 10 of FIG. 2 performs an XOR function on its two differential input signals, D1 and D1B and D2 and D2B.

As an example, consider a logic high applied to input terminal 16 and a corresponding logic low applied to input terminal 18. Also, a logic high applied to input terminal 56 and a corresponding logic low applied to input terminal 60. Thus, the differential signal D1 and D1B is in the same logic state as the differential signal D2 and D2B. For the above conditions, FETs 46 and 52 and 54 will be rendered operative while FETs 48, 50 and 58 will be rendered non-operative. This will provide a path to ground for the current provided by load device FET 28 via FETs 20, 46 and 54, thereby resulting in a logic low occurring at output terminal 26 as expected. Furthermore, the current provided by FET 32 will not have a path to ground since FET 58 is rendered non-operative, thereby resulting in a logic high occurring at output terminal 30 as expected. Therefore, it should be clear that the second embodiment is a two-input XOR latch circuit.

It is worth noting that gate circuit 10 was illustrated in two different embodiments: a simple data input gate for the circuit in FIG. 1, and an XOR gate for the circuit in FIG. 2. However, gate circuit 10 could also take the form of an AND gate or a multiplexer (MUX) gate or any gate circuit capable of providing complementary output logic signals at output terminals 26 and 30.

Hence it should be apparent from the foregoing discussion that a novel CDCFL latch circuit has been provided having shared load devices thereby resulting in minimum power dissipation and device count.

What is claimed is:

1. A complementary direct-coupled field-effect transistor logic latch circuit having a plurality of inputs and first and second outputs, comprising:
   gate means responsive to logic input signals supplied to the plurality of inputs for providing complementary output logic signals at the first and second outputs when said gate means is rendered operative;
   regeneration circuit means coupled to the first and second outputs for maintaining said complementary output logic signals at the first and second outputs when said regeneration circuit means is rendered operative and said gate means is rendered non-operative;
   shared load means for providing current to said gate means when said gate means is operative and for providing current to said regeneration circuit means when said regeneration circuit means is operative; and
   control circuit means responsive to complementary clock signals supplied to first and second inputs and coupled between said shared load means and both said gate and regeneration circuit means for alternately rendering said gate means and said regeneration circuit means operative and non-operative wherein said control circuit means includes:
   a first transistor having first, second and control electrodes, said first electrode being coupled to the second output and to said shared load means, said second electrode being coupled to said gate means, and said control electrode being coupled to said first input of said control circuit means;
   a second transistor having first, second and control electrodes, said first electrode being coupled to the first output and to said shared load means, said second electrode being coupled to said gate means, and said control electrode being coupled to said first input of said control circuit means;
   a third transistor having first, second and control electrodes, said first electrode being coupled to the first output and to said shared load means, said second electrode being coupled to said regeneration circuit means, and said control electrode being coupled to said second input of said control circuit means; and
   a fourth transistor having first, second and control electrodes, said first electrode being coupled to the second output and to said shared load means, said second electrode being coupled to said regeneration circuit means, and said control electrode being coupled to said second input of said control circuit means.

2. The complementary direct-coupled field-effect transistor logic latch circuit according to claim 1 wherein said shared load means includes:
   a first transistor having first, second and control electrodes, said first electrode being coupled to a first supply voltage terminal, and said second and control electrodes being coupled to said control circuit means; and
   a second transistor having first, second and control electrodes, said first electrode being coupled to said first supply voltage terminal, and said second and control electrodes being coupled to said control circuit means.

3. The complementary direct-coupled field-effect transistor logic latch circuit according to claim 1 wherein said regeneration circuit means includes:
   a first transistor having first, second and control electrodes, said first electrode being coupled to said control circuit means, said second electrode being coupled to a first supply voltage terminal, and said control electrode being coupled to the second output; and
   a second transistor having first, second and control electrodes, said first electrode being coupled to said control circuit means, said second electrode being coupled to said first supply voltage terminal, and said control electrode being coupled to the first output.

4. The complementary direct-coupled field-effect transistor logic latch circuit according to claim 1 wherein said gate means includes:
   a first transistor having first, second and control electrodes, said first electrode being coupled to said control circuit means, said second electrode being coupled to a first supply voltage terminal, and said control electrode being coupled to a first one of the plurality of inputs; and
   a second transistor having first, second and control electrodes, said first electrode being coupled to said control circuit means, said second electrode being coupled to said second electrode of said first transistor, and said control electrode being coupled to a second one of the plurality of inputs.

5. A complementary direct-coupled field-effect transistor logic latch circuit having a plurality of inputs and first and second outputs, comprising:
gate means responsive to logic input signals supplied to the plurality of inputs for providing complementary output logic signals at the first and second outputs when said gate means is rendered operative, said gate means includes:
(a) a first transistor having first, second and control electrodes, said first electrode being coupled to said control circuit means, and said control electrode being coupled to a first one of the plurality of inputs;
(b) a second transistor having first, second and control electrodes, said first electrode being coupled to said control circuit means, said second electrode being coupled to said second electrode of said first transistor, and said control electrode being coupled to a second one of the plurality of inputs;
(c) a third transistor having first, second and control electrodes, said first electrode being coupled to said first electrode of said first transistor, and said control electrode being coupled to said second one of the plurality of inputs;
(d) a fourth transistor having first, second and control electrodes, said first electrode being coupled to said first electrode of said second transistor, said second electrode being coupled to the second electrode of said third transistor, and said control electrode being coupled to said first one of the plurality of inputs;
(e) a fifth transistor having first, second and control electrodes, said first electrode being coupled to said second electrodes of said first and second transistors, said second electrode being coupled to a first supply voltage terminal, and said control electrode being coupled to a third one of the plurality of inputs; and
(f) a sixth transistor having first, second and control electrodes, said first electrode being coupled to said second electrodes of said third and fourth transistors, said second electrode being coupled to said second electrode of said fifth transistor, and said control electrode being coupled to a fourth one of the plurality of inputs;
regeneration circuit means coupled to the first and second outputs for maintaining said complementary output logic signals at the first and second outputs when said regeneration circuit means is rendered operative and said gate means is rendered non-operative;
shared load means for providing current to said gate means when said gate means is operative and for providing current to said regeneration circuit means when said regeneration circuit means is operative; and
control circuit means responsive to complementary clock signals supplied to first and second inputs and coupled between said shared load means and both said gate and regeneration circuit means for alternately rendering said gate means and said regeneration circuit means operative and non-operative.

6. A circuit having a plurality of inputs and second outputs, comprising:

a first transistor having first, second and control electrodes, said second electrode being coupled to a first supply voltage terminal, and said control electrode being coupled to a first one of the plurality of inputs;
a second transistor having first, second and control electrodes, said second electrode being coupled to said second electrode of said first transistor, and said control electrode being coupled to a second one of the plurality of inputs;
a third transistor having first, second and control electrodes, said first electrode being coupled to the second output, said second electrode being coupled to said first electrode of said first transistor, and said control electrode being coupled to a third one of the plurality of inputs;
a fourth transistor having first, second and control electrodes, said first electrode being coupled to the first output, said second electrode being coupled to said first electrode of said second transistor, and said control electrode being coupled to said third one of plurality of inputs;
a fifth transistor having first, second and control electrodes, said first electrode being coupled to the first output and said control electrode being coupled to a fourth one of the plurality of inputs;
a sixth transistor having first, second and control electrodes, said first electrode being coupled to the second output and said control electrode being coupled to said fourth one of the plurality of inputs;
a seventh transistor having first, second and control electrodes, said first electrode being coupled to said second electrode of said fifth transistor, said second electrode being coupled to said first supply voltage terminal, and said control electrode being coupled to the second output;
an eighth transistor having first, second and control electrodes, said first electrode being coupled to said second electrode of said sixth transistor, said second electrode being coupled to said first supply voltage terminal, and said control electrode being coupled to the first output;
a ninth transistor having a first, second and control electrodes, said first electrode being coupled to a second supply voltage terminal, and said second and control electrodes being coupled to said first electrodes of said fourth and fifth electrodes; and
a tenth transistor having first, second and control electrodes, said first electrode being coupled to said second supply voltage terminal, said second and control electrodes being coupled to said first electrodes of said third and sixth transistors.

7. A circuit having a plurality of inputs and first and second outputs, comprising:
a first transistor having first, second and control electrodes, said second electrode being coupled to a first supply voltage terminal, and said control electrode being coupled to a first one of the plurality of inputs;
a second transistor having first, second and control electrodes, said second electrode being coupled to said second electrode of said first transistor, and said control electrode being coupled to a second one of the plurality of inputs;
a third transistor having first, second and control electrodes, said second electrode being coupled to said first electrode of said first transistor, and said control electrode being coupled to a third one of the plurality of inputs;

a fourth transistor having first, second and control electrodes, said second electrode being coupled to said first electrode of said first transistor, and said control electrode being coupled to a fourth one of the plurality of inputs;

a fifth transistor having first, second and control electrodes, said first electrode being coupled to said first electrode of said third transistor, said second electrode being coupled to said first electrode of said second transistor, and said control electrode being coupled to said fourth one of the plurality of inputs;

a sixth transistor having first, second and control electrodes, said first electrode being coupled to said first electrode of said fourth transistor, said second electrode being coupled to said second electrode of said fifth transistor, and said control electrode being coupled to said third one of the plurality of inputs;

a seventh transistor having first, second and control electrodes, said first electrode being coupled to the second output, said second electrode being coupled to said first electrodes of said third and fifth transistors, and said control electrode being coupled to a fifth one of the plurality of inputs;

an eighth transistor having first, second and control electrodes, said first electrode being coupled to the first output, said second electrode being coupled to said first electrodes of said fourth and sixth transistors, and said control electrode being coupled to said fifth one of plurality of inputs;

a ninth transistor having first, second and control electrodes, said first electrode being coupled to the first output and said control electrode being coupled to a sixth one of the plurality of inputs;

a tenth transistor having first, second and control electrodes, said first electrode being coupled to the second output, and said control electrode being coupled to said sixth one of the plurality of inputs;

an eleventh transistor having first, second and control electrodes, said first electrode being coupled to said second electrode of said ninth transistor, said second electrode being coupled to said first supply voltage terminal, and said control electrode being coupled to the second output;

a twelfth transistor having first, second and control electrodes, said first electrode being coupled to said second electrode of said tenth transistor, said second electrode being coupled to said first supply voltage terminal, and said control electrode being coupled to the first output;

a thirteenth transistor having a first, second and control electrode, said first electrode being coupled to a second supply voltage terminal, and said second and control electrodes being coupled to said first electrodes of said eighth and ninth electrodes; and a fourteenth transistor having first, second and control electrodes, said first electrode being coupled to said second supply voltage terminal, said second and control electrodes being coupled to said first electrodes of said seventh and tenth transistors.

8. A complementary direct-coupled field-effect transistor logic latch circuit having a plurality of inputs and first and second outputs, comprising:

gate means responsive to logic input signals supplied to the plurality of inputs for providing complementary output logic signals at the first and second outputs when said gate means is rendered operative;

regeneration circuit means coupled to the first and second outputs for maintaining said complementary output logic signals at the first and second outputs when said regeneration circuit means is rendered operative;

shared load means for providing first and second currents; and control circuit means responsive to complementary clock signals supplied to first and second inputs of said control circuit means for alternately routing both said first and second currents of said shared load means through said gate means or said regeneration circuit means thereby respectively enabling said gate means or said regeneration means.

9. The complimentary direct-coupled field effect transistor logic latch circuit according to claim 8 wherein said control circuit means includes:

a first transistor having first, second and control electrodes, said first electrode being coupled to the second output and to receive said second current of said shared load means, said second electrode being coupled to said gate means, and said control electrode being coupled to said first input of said control circuit means;

a second transistor having first, second and control electrodes, said first electrode of said second transistor being coupled to the first output and to receive said first current of said shared load means, said second electrode of said second transistor being coupled to said gate means, and said control electrode of said second transistor being coupled to said first input of said control circuit means;

a third transistor having first, second and control electrodes, said first electrode of said third transistor being coupled to the first output and to receive said first current of said shared load means, said second electrode of said third transistor being coupled to said regeneration circuit means, and said control electrode of said third transistor being coupled to said second input of said control circuit means; and a fourth transistor having first, second and control electrodes, said first electrode of said fourth transistor being coupled to the second output and to receive said second current of said shared load means, said second electrode of said fourth transistor being coupled to said regeneration circuit means, and said control electrode of said fourth transistor being coupled to said second input of said control circuit means.

10. The complimentary direct-coupled field effect transistor logic latch circuit according to claim 9 wherein said gate means includes:

a first transistor having first, second and control electrodes, said first electrode being coupled to said control circuit means, said second electrode being coupled to a first supply voltage terminal, and said control electrode being coupled to a first one of the plurality of inputs; and a second transistor having first, second and control electrode, said first electrode of said second transistor being coupled to said control circuit means, said second electrode of said second transistor being coupled to said second electrode of said first transistor, and said control electrode of said second transistor being coupled to a second one of the plurality of inputs.

11. The complimentary direct-coupled field-effect transistor logic latch circuit according to claim 8 wherein said gate means includes:

a first transistor having first, second and control electrodes, said first electrode being coupled to said control circuit means, and said control electrode being coupled to a first one of the plurality of inputs;

a second transistor having first, second and control electrodes, said first electrode of said second transistor being coupled to said control circuit means, said second electrode of said second transistor being coupled to said second electrode of said first transistor, and said control electrode of said second transistor being coupled to a second one of the plurality of inputs;

a third transistor having first, second and control electrodes, said first electrode of said third transistor being coupled to said first electrode of said first transistor, and said control electrode of said third transistor being coupled to said second one of the plurality of inputs;

a fourth transistor having first, second and control electrodes, said first electrode of said fourth transistor being coupled to said first electrode of said second transistor, said second electrode of said fourth transistor being coupled to the second electrode of said third transistor, and said control electrode of said fourth transistor being coupled to said first one of the plurality of inputs;

a fifth transistor having first, second and control electrodes, said first electrode of said fifth transistor being coupled to said second electrodes of said first and second transistors, said second electrode of said fifth transistor being coupled to a first supply voltage terminal, and said control electrode of said fifth transistor being coupled to a third one of the plurality of inputs; and a sixth transistor having first, second and control electrodes, said first electrode of said sixth transistor being coupled to said second electrodes of said third and fourth transistors, said second electrode of said sixth transistor being coupled to said second electrode of said fifth transistor, and said control electrode of said sixth transistor being coupled to a fourth one of the plurality of inputs.

* * * * *